(12) United States Patent
Nagai

(10) Patent No.: US 9,711,486 B2
(45) Date of Patent: Jul. 18, 2017

(54) STACKED SEMICONDUCTOR DEVICE

(71) Applicant: FUJITSU LIMITED, Kawasaki-shi, Kanagawa (JP)

(72) Inventor: Toshiaki Nagai, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/991,465

(22) Filed: Jan. 8, 2016

(65) Prior Publication Data
US 2016/0233195 A1    Aug. 11, 2016

(30) Foreign Application Priority Data

Feb. 5, 2015  (JP) ................................. 2015-021119

(51) Int. Cl.
| | | |
|---|---|---|
| H01L 25/065 | (2006.01) | |
| H01L 23/522 | (2006.01) | |
| H01L 23/64 | (2006.01) | |

(52) U.S. Cl.
CPC ...... *H01L 25/0657* (2013.01); *H01L 23/5223* (2013.01); *H01L 23/5228* (2013.01); *H01L 23/642* (2013.01); *H01L 23/647* (2013.01); *H01L 2225/06527* (2013.01); *H01L 2225/06541* (2013.01)

(58) Field of Classification Search
CPC . H01L 25/0657; H01L 23/642; H01L 23/647; H01L 23/50; H01L 2225/06527; H01L 2225/06541
See application file for complete search history.

(56) References Cited

U.S. PATENT DOCUMENTS

2008/0258259 A1*  10/2008  Osaka ................... H01L 23/481
                                                                      257/532

FOREIGN PATENT DOCUMENTS

| JP | 2008-270581 | 11/2008 |
| JP | 2009-182087 | 8/2009 |
| JP | 2009182087 A * | 8/2009 |
| JP | 2012-174826 | 9/2012 |
| JP | 2012-204653 | 10/2012 |

* cited by examiner

*Primary Examiner* — Cuong B Nguyen
*Assistant Examiner* — Juanita Rhodes
(74) *Attorney, Agent, or Firm* — Fujitsu Patent Center

(57) ABSTRACT

A stacked semiconductor device includes: a plurality of stacked integrated-circuit chips that are to be mounted onto a substrate and including at least one power-supply target chip; a decoupling through-electrode transmission line including a decoupling power-supply-side through-electrode wiring line coupled to a power-supply terminal of the at least one power-supply target chip and a decoupling ground-side through-electrode wiring line coupled to a ground terminal of the at least one power-supply target chip; a resistor and a capacitor provided one of the plurality of integrated-circuit chips that is located at a termination of the decoupling through-electrode transmission line, the resistor having an impedance substantially equal to a characteristic impedance of the decoupling through-electrode transmission line, wherein the resistor and the capacitor are coupled in series.

12 Claims, 12 Drawing Sheets

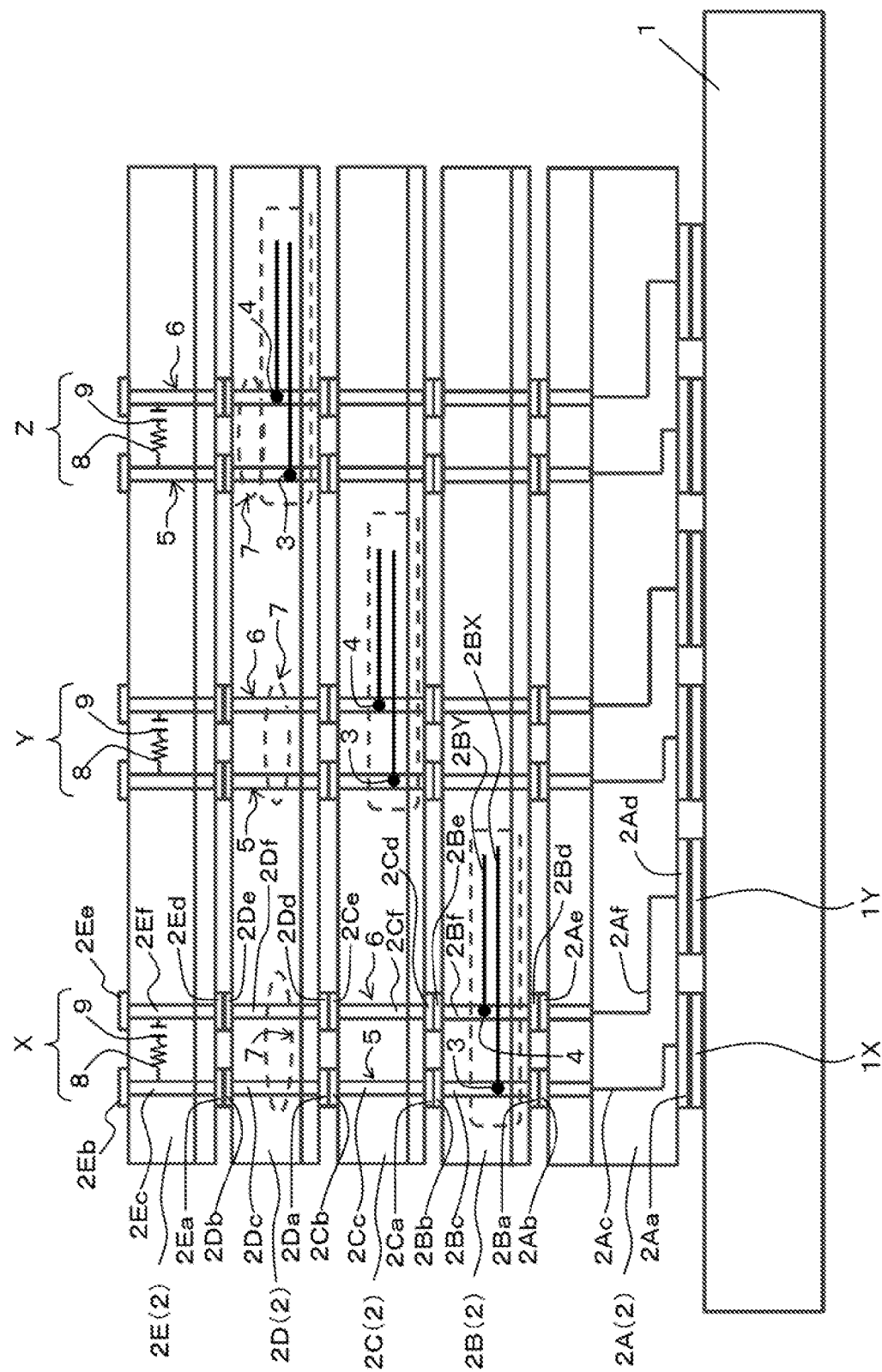

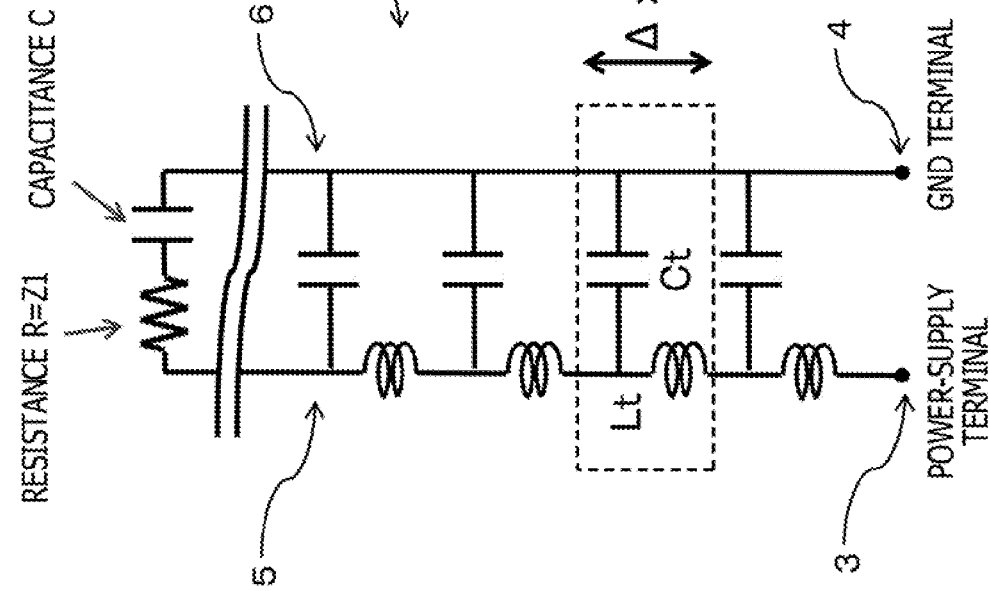
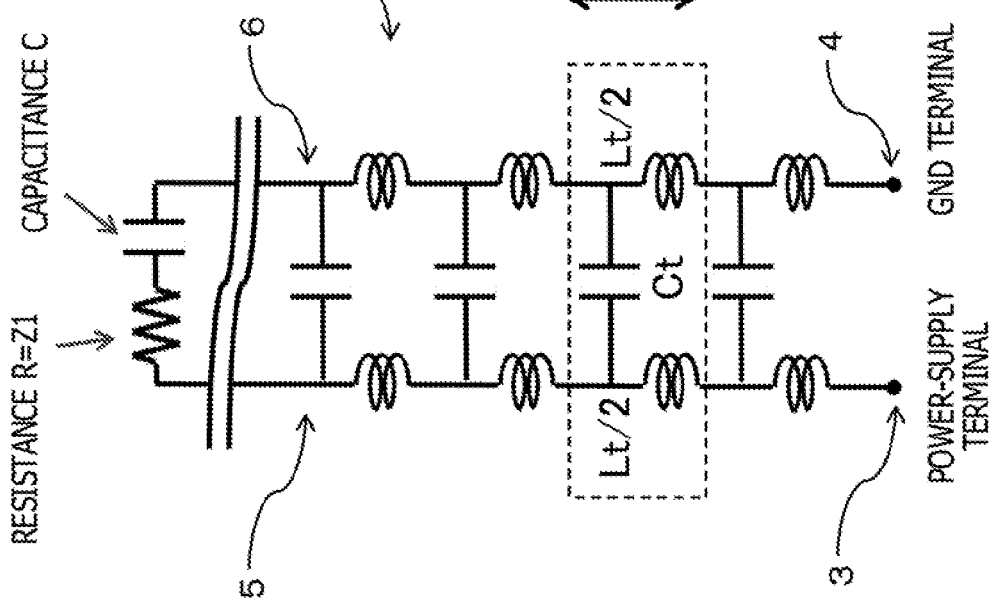

STACKED SEMICONDUCTOR DEVICE

CROSS-REFERENCE TO RELATED APPLICATION

This application is based upon and claims the benefit of priority of the prior Japanese Patent Application No. 2015-021119, filed on Feb. 5, 2015, the entire contents of which are incorporated herein by reference.

FIELD

The present embodiment relates to a stacked semiconductor device.

BACKGROUND

There have been provided semiconductor devices in which a plurality of integrated-circuit chips such as large-scale integration (LSI) chips, which are to be mounted onto a substrate, are stacked.

Japanese Laid-open Patent Publication Nos. 2008-270581, 2009-182087, 2012-204653, and No. 2012-174826 disclose related arts.

SUMMARY

According to an aspect of the embodiments, a stacked semiconductor device includes: a plurality of stacked integrated-circuit chips that are to be mounted onto a substrate and including at least one power-supply target chip; a decoupling through-electrode transmission line including a decoupling power-supply-side through-electrode wiring line coupled to a power-supply terminal of the at least one power-supply target chip and a decoupling ground-side through-electrode wiring line coupled to a ground terminal of the at least one power-supply target chip; a resistor and a capacitor provided one of the a plurality of integrated-circuit chips that is located at a termination of the decoupling through-electrode transmission line, the resistor having an impedance substantially equal to a characteristic impedance of the decoupling through-electrode transmission line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 illustrates an example of a stacked semiconductor device;

FIGS. 2A and 2B each illustrate an example of a decoupling through-electrode transmission line;

DESCRIPTION OF EMBODIMENTS

Figure 3:
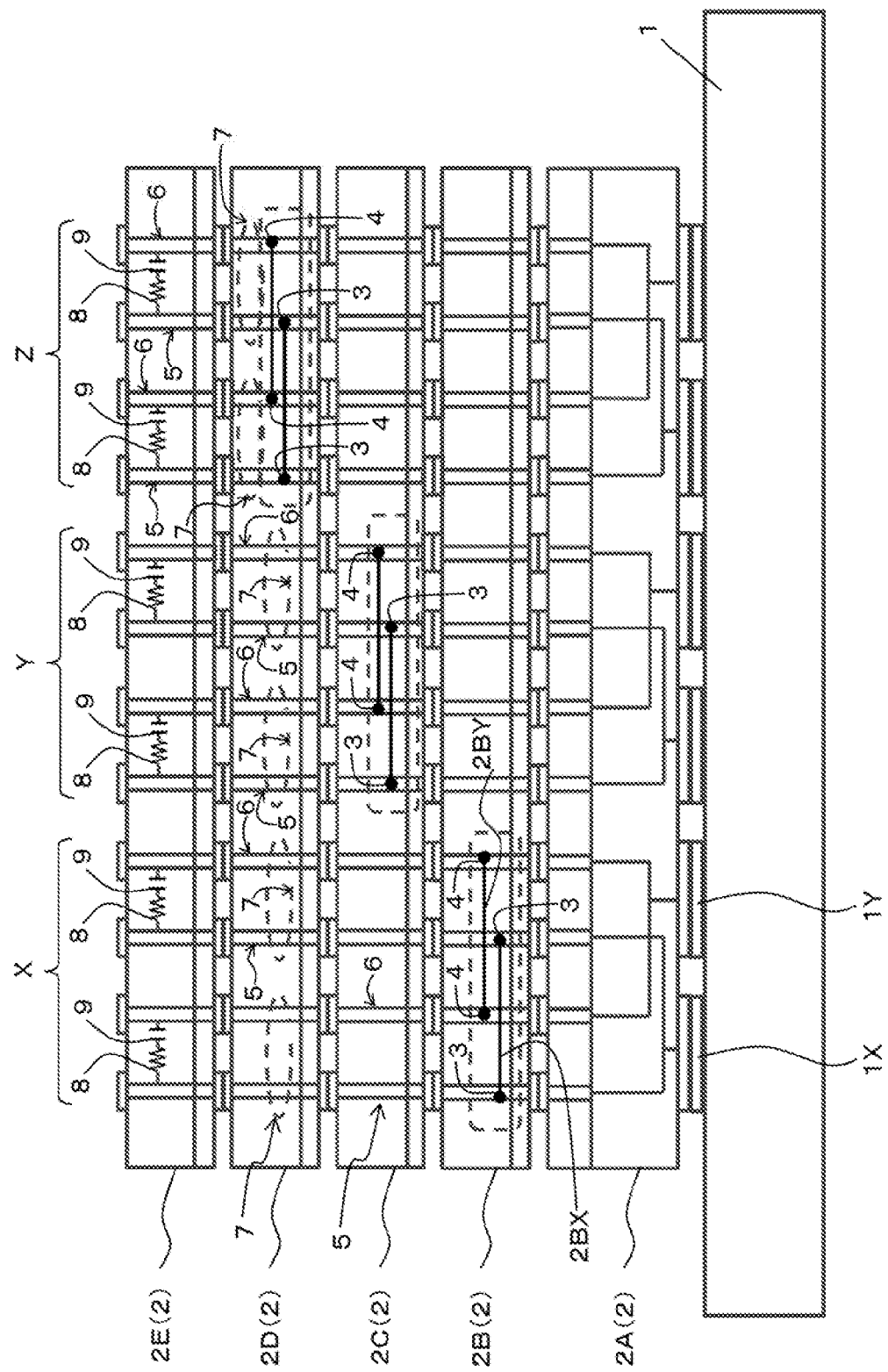
FIG. 3 illustrates an example of a stacked semiconductor device.

To remove power-supply noise and ground noise in an integrated circuit, the integrated circuit is provided with decoupling capacitors coupled between the power supply and the ground. In a semiconductor device including a plurality of stacked integrated-circuit chips that are to be mounted onto a substrate, decoupling capacitors mounted onto a highest-layer integrated-circuit chip, which is provided on a highest-layer, are each coupled to via holes mutually coupled and provided in the integrated-circuit chips.

Despite the connection of each decoupling capacitor through mutually coupled through-electrode wiring lines provided in the integrated circuit chips in the semiconductor device including a plurality of stacked integrated-circuit chips that are to be mounted onto a substrate, inductance components of the through-electrode wiring lines may hinder reduction of high-frequency power-supply noise and high-frequency ground noise. Hereinafter, power-supply noise may generally include ground noise.

FIG. 1 illustrates an example of a stacked semiconductor device. The stacked semiconductor device illustrated in FIG. 1 includes a plurality of stacked integrated-circuit chips 2 that are to be mounted onto a substrate 1. Integrated circuit chips 2B, 2C, and 2D that are power-supply target chips in the plurality of integrated-circuit chips 2 each have a power-supply terminal 3 and a ground terminal 4. The power-supply terminal 3 and the ground terminal 4 are coupled to a decoupling power-supply-side through-electrode wiring line 5 and a decoupling ground-side through-electrode wiring line 6, respectively. The decoupling power-supply-side through-electrode wiring line 5 and the decoupling ground-side through-electrode wiring line 6 form a decoupling through-electrode transmission line 7. A resistor 8 having an impedance equal to a characteristic impedance of the decoupling through-electrode transmission line 7 and a capacitor 9 are coupled in series in the corresponding integrated-circuit chip located on the termination of the decoupling through-electrode transmission line 7. The stacked semiconductor device may be referred to as a semiconductor device with a three-dimensionally stacked structure, a stacked semiconductor integrated circuit, a stacked LSI circuit, or a three-dimensional-LSI (3D-LSI) circuit.

Examples of the integrated-circuit chips 2 may include a semiconductor integrated circuit chip such as an LSI chip, and an interposer and an integrated-circuit chip that include fine wiring lines and passive elements formed on, for example, a Si or glass substrate. The term "LSI chip" may denote an LSI die that does not include an LSI package. Five integrated-circuit chips 2A, 2B, 2C, 2D, and 2E to be mounted onto the substrate 1 are stacked on and coupled to one another. The three integrated-circuit chips 2B to 2D between the highest integrated-circuit chip 2E and the lowest integrated-circuit chip, for example, the integrated-circuit chip 2A on the substrate side may be power-supply target chips.

The lowest integrated-circuit chip (lowest-layer integrated-circuit chip) 2A may be an interposer, and the second- to fourth-lowest integrated-circuit chips, for example, the second- to fourth-layer integrated-circuit chips 2B to 2D may be LSI chips. The highest integrated-circuit chip, for example, the highest-layer integrated-circuit chip 2E may be an LSI chip or an integrated-circuit chip having passive elements formed on a Si or glass substrate. Other electronic components and integrated circuits may be stacked on the lowest integrated-circuit chip 2A at positions different from positions where the integrated-circuit chips 2B to 2E are stacked, and wiring lines coupling the components and the integrated circuits may be formed. The lowest integrated-circuit chip 2A may be an LSI chip.

A region denoted by X is a power supply structure for power supply to and decoupling for the second-lowest integrated-circuit chip 2B. A region denoted by Y is a power supply structure for power supply to and decoupling for the third-lowest integrated-circuit chip 2C. A region denoted by Z is a power supply structure for power supply to and decoupling for the fourth-lowest integrated-circuit chip 2D.

The power supply structure for power supply to and decoupling for the second-lowest integrated-circuit chip 2B may be, for example, the region X illustrated in FIG. 1. For example, the lowest integrated-circuit chip 2A includes a power-supply-side lower electrode 2Aa, a power-supply-side upper electrode 2Ab, and a power-supply-side wiring line 2Ac coupling the above electrodes. The second-lowest integrated-circuit chip 2B that is a power-supply target chip includes a power-supply-side lower electrode 2Ba, a power-supply-side upper electrode 2Bb, and a power-supply-side through electrode 2Bc coupling the above electrodes. An in-chip power-supply wiring line 2BX (for example, see region enclosed by corresponding dotted line illustrated in FIG. 1) is coupled to the power-supply-side through electrode 2Bc.

The power-supply-side lower electrode 2Aa of the lowest integrated-circuit chip 2A is coupled to a power-supply electrode 1X disposed on the substrate 1 and coupled to the power supply. The power-supply-side lower electrode 2Ba of the second-lowest integrated-circuit chip 2B is coupled to the power-supply-side upper electrode 2Ab of the lowest integrated-circuit chip 2A. The in-chip power-supply wiring line 2BX of the second-lowest integrated-circuit chip 2B is coupled to the power-supply electrode 1X on the substrate 1 through the power-supply-side lower electrode 2Aa, the power-supply-side wiring line 2Ac and the power-supply-side upper electrode 2Ab of the lowest integrated-circuit chip 2A and through the power-supply-side lower electrode 2Ba and the power-supply-side through electrode 2Bc of the second-lowest integrated-circuit chip 2B. Power is thus supplied to the second-lowest integrated-circuit chip 2B.

A portion where the power-supply-side through electrode 2Bc of the second-lowest integrated-circuit chip 2B is coupled to the in-chip power-supply wiring line 2BX may be referred to as the power-supply terminal 3. A portion extending from the power-supply-side lower electrode 2Aa of the lowest integrated-circuit chip 2A to the portion where the in-chip power-supply wiring line 2BX in the power-supply-side through electrode 2Bc of the second-lowest integrated-circuit chip 2B is coupled, through the power-supply-side wiring line 2Ac and the power-supply-side upper electrode 2Ab of the lowest integrated-circuit chip 2A and the power-supply-side lower electrode 2Ba of the second-lowest integrated-circuit chip 2B, may be a power-supply wiring line.

The lowest integrated-circuit chip 2A includes a ground-side lower electrode 2Ad, a ground-side upper electrode 2Ae, and a ground-side wiring line 2Af that couples the above electrodes. The second-lowest integrated-circuit chip 2B that is a power-supply target chip includes a ground-side lower electrode 2Bd, a ground-side upper electrode 2Be, and a ground-side through electrode 2Bf coupling the above electrodes. An in-chip ground wiring line 2BY (for example, see region enclosed by corresponding dotted line illustrated in FIG. 1) is coupled to the ground-side through electrode 2Bf.

The ground-side lower electrode 2Ad of the lowest integrated-circuit chip 2A is coupled to a ground electrode 1Y disposed on the substrate 1 and connected to the ground. The ground-side lower electrode 2Bd of the second-lowest integrated-circuit chip 2B is coupled to the ground-side upper electrode 2Ae of the lowest integrated-circuit chip 2A. The in-chip ground wiring line 2BY of the second-lowest integrated-circuit chip 2B is coupled to the ground electrode 1Y on the substrate 1 through the ground-side lower electrode 2Ad, the ground-side wiring line 2Af, the ground-side upper electrode 2Ae of the lowest integrated-circuit chip 2A and through the ground-side lower electrode 2Bd and the ground-side through electrode 2Bf of the second-lowest integrated-circuit chip 2B.

A portion where the ground-side through electrode 2Bf of the second-lowest integrated-circuit chip 2B is couple to the in-chip ground wiring line 2BY may be referred to as the ground terminal 4. A portion extending from the ground-side lower electrode 2Ad of the lowest integrated-circuit chip 2A to the portion where the in-chip ground wiring line 2BY in the ground-side through electrode 2Bf of the second-lowest integrated-circuit chip 2B, through the ground-side wiring line 2Af and the ground-side upper electrode 2Ae of the lowest integrated-circuit chip 2A and through the ground-side lower electrode 2Bd of the second-lowest integrated-circuit chip 2B, may be a ground wiring line.

The third-lowest integrated-circuit chip 2C, the fourth-lowest integrated-circuit chip 2D, and the highest integrated-circuit chip 2E respectively include power-supply-side lower electrodes 2Ca, 2Da, and 2Ea, power-supply-side upper electrodes 2Cb, 2Db, and 2Eb, and power-supply-side through electrodes 2Cc, 2Dc and 2Ec coupling the power-supply-side lower electrodes and the power-supply-side upper electrodes. The power-supply-side lower electrode 2Ca of the third-lowest integrated-circuit chip 2C is coupled the power-supply-side upper electrode 2Bb of the second-lowest integrated-circuit chip 2B. The power-supply-side lower electrode 2Da of the fourth-lowest integrated-circuit chip 2D is connected to the power-supply-side upper electrode 2Cb of the third-lowest integrated-circuit chip 2C. The power-supply-side lower electrode 2Ea of the highest integrated-circuit chip 2E is coupled to the power-supply-side upper electrode 2Db of the fourth-lowest integrated-circuit chip 2D.

An upper portion of the second-lowest integrated-circuit chip 2B with respect to the connection portion where the in-chip power-supply wiring line 2BX in the power-supply-side through electrode 2Bc of the second-lowest integrated-circuit chip 2B, the power-supply-side upper electrode 2Bb of the second-lowest integrated-circuit chip 2B, the power-supply-side lower electrode 2Ca of the third-lowest integrated-circuit chip 2C, the power-supply-side through electrode 2Cc of the third-lowest integrated-circuit chip 2C, the power-supply-side upper electrode 2Cb of the third-lowest integrated-circuit chip 2C, the power-supply-side lower electrode 2Da of the fourth-lowest integrated-circuit chip 2D, the power-supply-side through electrode 2Dc of the fourth-lowest integrated-circuit chip 2D, the power-supply-side upper electrode 2Db of the fourth-lowest integrated-circuit chip 2D, the power-supply-side lower electrode 2Ea of the highest integrated-circuit chip 2E, and the power-supply-side through electrode 2Ec of the highest integrated-circuit chip 2E are coupled to the power-supply terminal 3 of the second-lowest integrated-circuit chip 2B.

The decoupling power-supply-side through-electrode wiring line 5 is composed of the upper portion of the second-lowest integrated-circuit chip 2B with respect to the connection portion where the in-chip power-supply wiring line 2BX in the power-supply-side through electrode 2Bc of the second-lowest integrated-circuit chip 2B, the power-supply-side upper electrode 2Bb of the second-lowest integrated-circuit chip 2B, the power-supply-side lower electrode 2Ca of the third-lowest integrated-circuit chip 2C, the power-supply-side through electrode 2Cc of the third-lowest integrated-circuit chip 2C, the power-supply-side upper electrode 2Cb of the third-lowest integrated-circuit chip 2C, the power-supply-side lower electrode 2Da of the fourth-lowest integrated-circuit chip 2D, the power-supply-side through electrode 2Dc of the fourth-lowest integrated-circuit chip 2D, the power-supply-side upper electrode 2Db of the fourth-lowest integrated-circuit chip 2D, the power-supply-side lower electrode 2Ea of the highest integrated-circuit chip 2E, and the power-supply-side through electrode 2Ec of the highest integrated-circuit chip 2E. The decoupling power-supply-side through-electrode wiring line 5 is composed of, for example, a portion where the power-supply-side through electrodes 2Bc, 2Cc, 2Dc, and 2Ec are coupled to one another. The decoupling power-supply-side through-electrode wiring line 5 is coupled to the power-supply terminal 3 of the second-lowest integrated-circuit chip 2B that is a power-supply target chip.

The decoupling power-supply-side through-electrode wiring line 5 extends toward a portion above the second-lowest integrated-circuit chip 2B that is a power-supply target chip. The decoupling power-supply-side through-electrode wiring line 5 extends from the second-lowest integrated-circuit chip 2B that is a power-supply target chip to the highest integrated-circuit chip 2E in such a manner as to penetrate through the integrated-circuit chips 2B, 2C, 2D, and 2E. The third-lowest integrated-circuit chip 2C, the fourth-lowest integrated-circuit chip 2D, and the highest integrated-circuit chip 2E respectively include ground-side lower electrodes 2Cd, 2Dd, and 2Ed, ground-side upper electrodes 2Ce, 2De, and 2Ee, and ground-side through electrodes 2Cf, 2Df, and 2Ef coupling the ground-side lower electrodes and the ground-side upper electrodes.

The ground-side lower electrode 2Cd of the third-lowest integrated-circuit chip 2C is coupled to the ground-side upper electrode 2Be of the second-lowest integrated-circuit chip 2B. The ground-side lower electrode 2Dd of the fourth-lowest integrated-circuit chip 2D is coupled to the ground-side upper electrode 2Ce of the third-lowest integrated-circuit chip 2C. The ground-side lower electrode 2Ed of the highest integrated-circuit chip 2E is coupled to the ground-side upper electrode 2De of the fourth-lowest integrated-circuit chip 2D.

An upper portion of the second-lowest integrated-circuit chip 2B with respect to the connection portion where the in-chip ground wiring line 2BY in the ground-side through electrode 2Bf of the second-lowest integrated-circuit chip 2B, the ground-side upper electrode 2Be of the second-lowest integrated-circuit chip 2B, the ground-side lower electrode 2Cd, the ground-side through electrode 2Cf of the third-lowest integrated-circuit chip 2C, the ground-side upper electrode 2Ce of the third-lowest integrated-circuit chip 2C, the ground-side lower electrode 2Dd of the fourth-lowest integrated-circuit chip 2D, the ground-side through electrode 2Df of the fourth-lowest integrated-circuit chip 2D, the ground-side upper electrode 2De of the fourth-lowest integrated-circuit chip 2D, the ground-side lower electrode 2Ed of the highest integrated-circuit chip 2E, and the ground-side through electrode 2Ef of the highest integrated-circuit chip 2E are coupled to the ground terminal 4 of the second-lowest integrated-circuit chip 2B.

The decoupling ground-side through-electrode wiring line 6 is composed of the upper portion of the second-lowest integrated-circuit chip 2B with respect to the connection portion where the in-chip ground wiring line 2BY in the in-chip ground wiring line 2BY of the second-lowest integrated-circuit chip 2B, the ground-side upper electrode 2Be of the second-lowest integrated-circuit chip 2B, the ground-side lower electrode 2Cd of the third-lowest integrated-circuit chip 2C, the ground-side through electrode 2Cf of the third-lowest integrated-circuit chip 2C, the ground-side upper electrode 2Ce of the third-lowest integrated-circuit chip 2C, the ground-side lower electrode 2Dd of the fourth-lowest integrated-circuit chip 2D, the ground-side through electrode 2Df of the fourth-lowest integrated-circuit chip 2D, the ground-side upper electrode 2De of the fourth-lowest integrated-circuit chip 2D, the ground-side lower electrode 2Ed of the highest integrated-circuit chip 2E, and the ground-side through electrode 2Ef of the highest integrated-circuit chip 2E. The decoupling ground-side through-electrode wiring line 6 is composed of, for example, a portion where the ground-side through electrodes 2Bf, 2Cf, 2Df, and 2Ef are coupled to one another. The decoupling ground-side through-electrode wiring line 6 is coupled to the ground terminal 4 of the second-lowest integrated-circuit chip 2B that is a power-supply target chip.

In this case, the decoupling ground-side through-electrode wiring line 6 extends toward a portion above the second-lowest integrated-circuit chip 2B that is a power-supply target chip. The decoupling ground-side through-electrode wiring line 6 extends from the second-lowest integrated-circuit chip 2B that is a power-supply target chip to the highest integrated-circuit chip 2E in such a manner as to penetrate through the integrated-circuit chips 2B, 2C, 2D, and 2E. In a case where the integrated-circuit chips 2B, 2C, 2D, and 2E are Si chips, the power-supply-side through electrodes 2Bc, 2Cc, 2Dc, and 2Ec and the ground-side through electrodes 2Bf, 2Cf, 2Df, and 2Ef that are disposed in the respective integrated-circuit chips 2B, 2C, 2D, and 2E may each be referred to as a via penetrating through an Si chip, for example, a through silicon via (TSV).

The decoupling power-supply-side through-electrode wiring line 5 and the decoupling ground-side through-electrode wiring line 6 form the decoupling through-electrode transmission line 7. The decoupling power-supply-side through-electrode wiring line 5 and the decoupling ground-side through-electrode wiring line 6 form the decoupling through-electrode transmission line 7 having a certain characteristic impedance caused by distributed capacitances and distributed inductances that exist along and between the decoupling power-supply-side through-electrode wiring line 5 and the decoupling ground-side through-electrode wiring line 6.

For example, the decoupling power-supply-side through-electrode wiring line 5 and the decoupling ground-side through-electrode wiring line 6 described above may be arranged in such a manner as to be close to each other. FIGS. 2A and 2B each illustrate an example of a decoupling through-electrode transmission line. FIGS. 2A and 2B each illustrate a decoupling through-electrode transmission line having a characteristic impedance Z1 of a stacked semiconductor device. As illustrate in FIGS. 2A and 2B, in the decoupling through-electrode wiring lines 5 and 6, distributed capacitances that are almost evenly distributed in the longitudinal direction of the decoupling through-electrode wiring lines 5 and 6 (a capacitance per length Δx is denoted by Ct) are coupled to each other, and distributed inductance components are almost evenly distributed (an inductance per length Δx is denoted by Lt). The decoupling through-electrode wiring lines 5 and 6 form the decoupling through-electrode transmission line 7 having a certain characteristic impedance (obtained in accordance with $Z1=\sqrt{(Lt/Ct)}$).

Figure 8A:
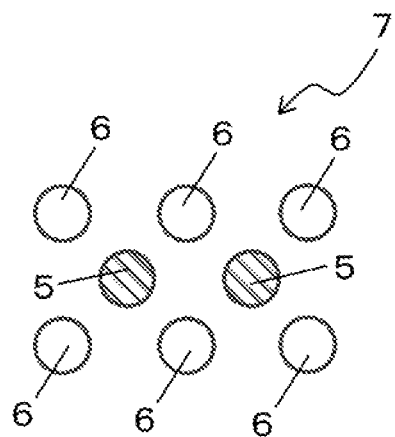
FIG. 8A illustrates an example of a plan view of a stacked semiconductor device.
Figure 8B:
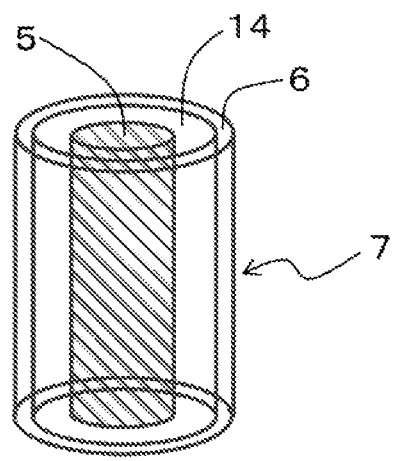
FIG. 8B illustrates an example of a perspective view of a stacked semiconductor device.

FIG. 2A illustrates a model of a transmission line in which the decoupling power-supply-side through-electrode wiring line 5 and the decoupling ground-side through-electrode wiring line 6 have a symmetrical structure. Reference Lt denotes a total inductance per length Δx in the decoupling power-supply-side through-electrode wiring line 5 and the decoupling ground-side through-electrode wiring line 6. The structure may be suitable for such a case where power-supply noise and ground noise act symmetrically and in opposite directions. FIG. 2B illustrates a model of a transmission line in which the decoupling power-supply-side through-electrode wiring line 5 and the decoupling ground-side through-electrode wiring line 6 have a structure as illustrated in FIG. 8A or 8B. The structure may be suitable for a case where ground noise is lower than power-supply noise.

As illustrated in FIG. 1, one decoupling power-supply-side through-electrode wiring line 5 and one decoupling ground-side through-electrode wiring line 6 may form one decoupling through-electrode transmission line 7. The decoupling through-electrode transmission line 7 extends toward a portion above the second-lowest integrated-circuit chip 2B that is a power-supply target chip. The decoupling through-electrode transmission line 7 extends from the second-lowest integrated-circuit chip 2B that is a power-supply target chip to the highest integrated-circuit chip 2E.

For example, the second-lowest integrated-circuit chip 2B that is a power-supply target chip may be an integrated-circuit chip outside which high-frequency decoupling is desirably formed. Hence, the power-supply terminal 3 and the ground terminal 4 in the integrated-circuit chip 2B are coupled to the highest integrated-circuit chip 2E including the resistor 8 and the capacitor 9 and having the decoupling function, by using the decoupling through-electrode transmission line 7.

The resistor 8 having an impedance (a resistance value R=Z1) equal to the characteristic impedance (Z1) of the decoupling through-electrode transmission line 7 and the capacitor 9 (a capacitance value C) are coupled to the termination of the decoupling through-electrode transmission line 7 (see FIGS. 2A and 2B). Note that the resistor 8 having an impedance equal to the characteristic impedance of the decoupling through-electrode transmission line 7 may include a resistor having an impedance almost equal to the characteristic impedance of the decoupling through-electrode transmission line 7.

The value (capacitance value) R of the capacitor 9 may be set to satisfy $R \gg 1/(2\pi fC)$ in a high-frequency band ($\geq f$) in which the power-supply noise is desirably reduced. The resistor 8 and the capacitor 9 are disposed in the highest integrated-circuit chip 2E of the plurality of integrated-circuit chips 2. For example, the highest integrated-circuit chip 2E includes the resistor 8 and the capacitor 9 and has the decoupling function. The resistor 8 may be referred to as a decoupling resistor. The capacitor 9 may be referred to as a decoupling capacitor or a decoupling condenser. For example, to reduce parasitic inductance, the resistor 8 and the capacitor 9 may be formed in the Si or wiring layer in the integrated-circuit chip. The resistor 8 and the capacitor 9 are coupled in series. The resistor 8 and the capacitor 9 connected in series are coupled to the termination of the decoupling through-electrode transmission line 7 extending to the highest integrated-circuit chip 2E.

In the highest integrated-circuit chip 2E located on the termination of the decoupling through-electrode transmission line 7 having the characteristic impedance Z1, a portion between the decoupling power-supply-side through-electrode wiring line 5 and the decoupling ground-side through-electrode wiring line 6 that extend to the highest integrated-circuit chip 2E is terminated with the series connection of a resistor having the resistance value R equal to the characteristic impedance Z1 and a capacitor having the capacitance value C, the decoupling power-supply-side through-electrode wiring line 5 and the decoupling ground-side through-electrode wiring line 6 forming the decoupling through-electrode transmission line 7 having the characteristic impedance Z1.

In the high-frequency band (f: $R \gg 1/(2\pi fC)$), the impedance of the capacitor having the capacitance value C may be ignored in comparison with the resistor having the resistance value R. Since the termination is performed with the resistor having the resistance value R equal to the characteristic impedance Z1 of the decoupling through-electrode transmission line 7, inductance components of the decoupling through-electrode wiring lines 5 and 6 composed of the through electrodes and the like may be effectively reduced. The impedance in the power-supply decoupling in high frequencies may be set at a value close to the resistance value R regardless of the lengths of the decoupling through-electrode wiring lines 5 and 6.

The inductance components of the decoupling through-electrode wiring lines 5 and 6 including the through electrodes and the like are effectively reduced, and an increase in impedance at a high frequency is thus reduced. Deterioration of the high-frequency characteristic of decoupling, for example, deterioration of a high-frequency power-supply-noise reduction effect may be reduced. The inductance components of the decoupling through-electrode wiring lines 5 and 6 including the through electrodes and the like are effectively reduced, and an increase in impedance at a high frequency is thus reduced. Parallel inductance-capacitance (LC) resonance at a high frequency attributable to the inductance components of the decoupling through-electrode wiring lines 5 and 6 including the through electrodes and the like may also be reduced. An increase in power-supply impedance is thus reduced, and electromagnetic noise emission outside the chips may thus be reduced.

The power supply structure for power supply to the second-lowest integrated-circuit chip 2B, for example, the region denoted by X illustrated in FIG. 1 has heretofore been described. However, the power supply structures for power supply to the third-lowest integrated-circuit chip 2C and the fourth-lowest integrated-circuit chip 2D, respectively, for example, the regions denoted by Y and Z illustrated in FIG. 1, respectively, may also be similar to the power supply structure for power supply to the second-lowest integrated-circuit chip 2B, for example, the region denoted by X illustrated in FIG. 1.

For example, an operation such as switching in a circuit in an integrated-circuit chip such as an LSI chip causes rapid fluctuation in power supply current, and the impedance of a power-supply wiring line, for example, an inductance component thus causes power-supply noise (supply voltage noise) in high frequencies. High power-supply noise causes a malfunction of the integrated-circuit chip. Accordingly, a power-supply decoupling capacitor is coupled between the power supply and the ground to reduce the power-supply noise.

To hinder deterioration of the high-frequency power-supply-noise reduction effect, the inductance component of the power-supply decoupling capacitor is reduced, and the inductance of connection wiring from the power-supply-noise source to the power-supply decoupling capacitor is decreased. For example, the length of the connection wiring may be decreased. An in-chip decoupling capacitor is disposed near the power-supply-noise source in the power-supply target chip to minimize the inductance of the connection wiring, and the high-frequency power-supply-noise reduction effect is not thereby deteriorated. This may lead to a favorable high-frequency characteristic.

To reduce low-frequency power-supply noise, an out-chip decoupling capacitor having a high capacitance may be provided on a semiconductor package outside a power-supply target chip, a substrate outside the semiconductor package, or the like, by using a relatively long connection wiring line, because the inductance component of the connection wiring has a small influence. For example, to reduce the high-frequency power-supply noise, the capacitance of the in-chip decoupling capacitor disposed near the power-supply-noise source in the power-supply target chip is desirably increased as much as possible. However, a sufficient capacitance may not be secured due to a limited space in the power-supply target chip or the like.

It is not easy to correctly estimate a capacitance value for an in-chip decoupling capacitor, and the capacitance may turn out to be insufficient after the chip is designed or manufactured. In this case, simply providing an out-chip decoupling capacitor, which does not have a favorable high-frequency characteristic due to a high inductance of connection wiring, does not enable compensation for the shortage of the in-chip decoupling capacitor. Designing the chip may be performed again and may incur an extra time and costs.

Accordingly, the out-chip decoupling capacitor, which is provided outside the power-supply target chip, may be used in such a manner that the inductance of the connection wiring is decreased to obtain a favorable high-frequency characteristic. The in-chip decoupling capacitor and the out-chip decoupling capacitor have inductance of the wiring or the capacitors themselves, generate parallel LC resonance and thus have a power-supply impedance peak. In this case, a capacitor having a damping resistance component is used as the out-chip decoupling capacitor, and the peak is thereby reduced. However, an excessively high damping resistance value may hinder current from flowing to the capacitor and deteriorates the decoupling effect. Accordingly, an appropriate damping resistance value may be set.

For example, in a semiconductor device including a plurality of stacked integrated-circuit chips that are to be mounted onto a substrate, such as a 3D-LSI circuit, an out-chip decoupling capacitor in addition to an in-chip decoupling capacitor is coupled to the integrated-circuit chips through electrodes provided in the integrated-circuit chips. Inductance components of the through electrodes may deteriorate the high-frequency characteristic of decoupling.

The inductance components of the through electrodes or the like and capacitance components formed by the in-chip and out-chip decoupling capacitors and the like cause parallel LC resonance, and the power-supply impedance may be increased. The electromagnetic noise emission (electromagnetic emission) may occur outside the chips at the time of resonance.

In this case, through electrodes having a high resistance or the like are used, and thus the resonance may be reduced due to a damping resistance. However, an excessively high damping resistance value deteriorates the decoupling effect on the contrary, and an appropriate value may thus be set. However, it is difficult to estimate a correct value of capacitance of an in-chip decoupling capacitor, and it may thus be difficult to set an appropriate damping resistance value.

Accordingly, an out-chip decoupling function may be used in such a manner that the inductance components of the through electrodes or the like are reduced to obtain a favorable high-frequency characteristic. In a semiconductor device including a plurality of stacked integrated-circuit chips that are to be mounted onto a substrate, simply coupling a decoupling capacitor to the termination of the mutually coupled through-electrode wiring lines provided in the integrated-circuit chips may not result in a high-frequency power-supply-noise reduction effect due to the inductance components of the through-electrode wiring lines.

Hence, the configuration described above may be employed to obtain a favorable high-frequency power-supply-noise reduction effect. A favorable high-frequency power-supply-noise reduction effect may be obtained. When the configuration described above is employed, the inductance components of the decoupling through-electrode wiring lines 5 and 6 including the through electrodes and the like are effectively reduced, and an increase in impedance at a high frequency is thus reduced. Accordingly, deterioration of the high-frequency characteristic of decoupling, for example, deterioration of the high-frequency power-supply-noise reduction effect may be reduced.

The inductance components of the decoupling through-electrode wiring lines 5 and 6 including the through electrodes and the like are effectively reduced, and an increase in impedance at a high frequency is thus reduced. The parallel LC resonance attributable to the inductance components of the decoupling through-electrode wiring lines 5 and 6 including the through electrodes and the like is also reduced. Accordingly, an increase in the power-supply impedance caused by the resonance is reduced, and the electromagnetic noise emission to the outside of the chips may be reduced.

With the configuration described above, the inductance components of the decoupling through-electrode wiring lines 5 and 6 including the through electrodes and the like are effectively reduced, and such an out-chip decoupling function that provides a favorable high-frequency characteristic may be used. FIG. 3 illustrates an example of a stacked semiconductor device. As illustrated in FIG. 3, a plurality of decoupling through-electrode transmission lines 7, for example, two decoupling through-electrode transmission lines 7 may be provided parallel to each other, the decoupling through-electrode transmission lines 7 each including one decoupling power-supply-side through-electrode wiring line 5 and one decoupling ground-side through-electrode wiring line 6. In this case, the decoupling through-electrode transmission lines 7 are connected parallel to the in-chip power-supply wiring line 2BX through the power-supply terminals 3 and to the in-chip ground wiring line 2BY through the ground terminals 4. A large number of decoupling structures each using the decoupling through-electrode transmission line 7 may be provided parallel to each other. One decoupling through-electrode transmission line 7 may include one decoupling power-supply-side through-electrode wiring line 5 and one decoupling ground-side through-electrode wiring line 6. For example, the decoupling through-electrode transmission line 7 may also include one or more decoupling power-supply-side through-electrode wiring lines 5 and one or more decoupling ground-side through-electrode wiring lines 6.

Figure 4:
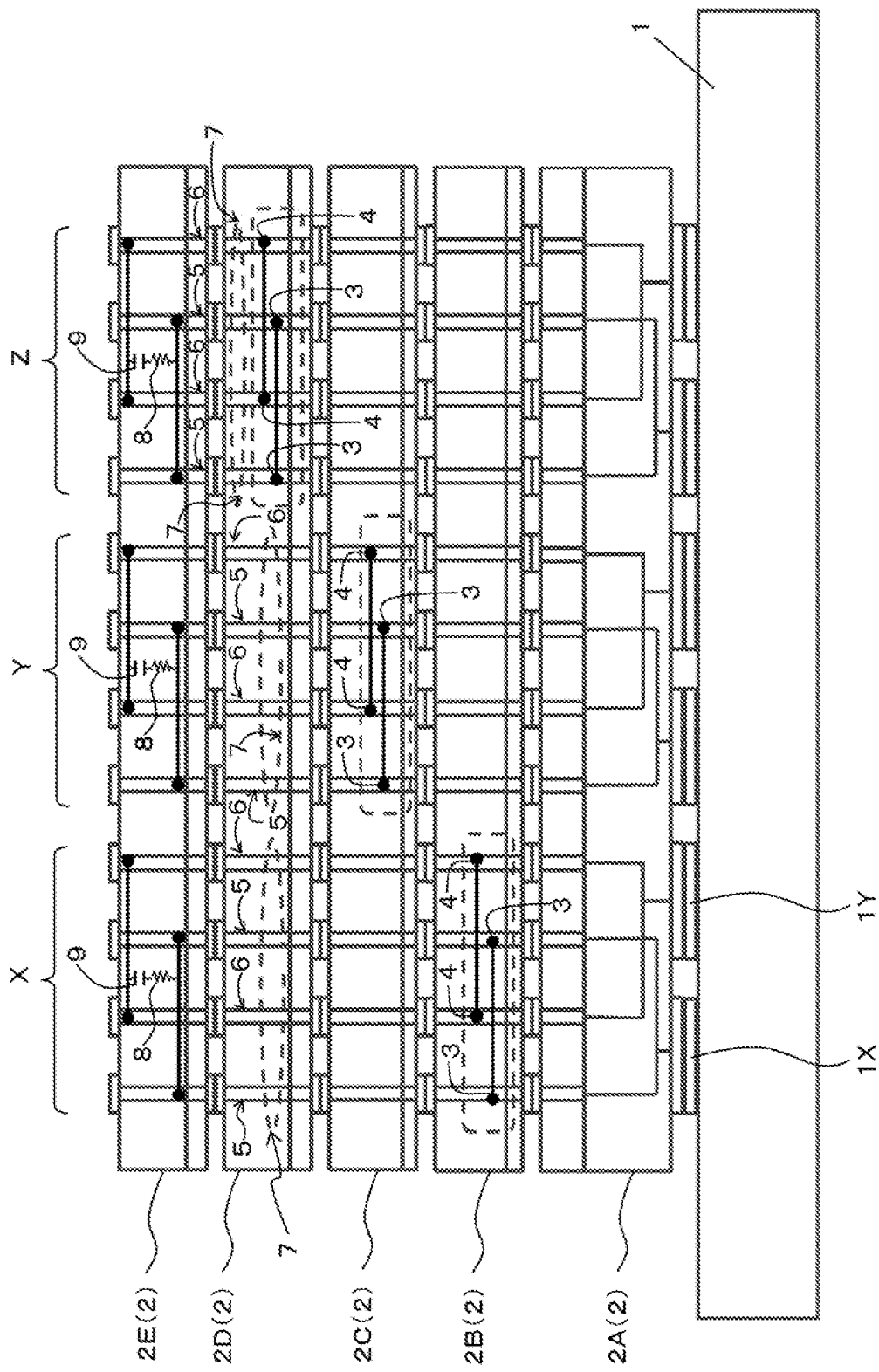
FIG. 4 illustrates an example of a stacked semiconductor device.

FIG. 4 illustrates a example of a stacked semiconductor device. For example, as illustrated in FIG. 4, one decoupling through-electrode transmission line 7 may include a plurality of, for example, two decoupling power-supply-side through-electrode wiring lines 5 and a plurality of, for example, two decoupling ground-side through-electrode wiring lines 6. In this case, at least one resistor 8 and at least one capacitor 9 may be provided to the one decoupling through-electrode transmission line 7 having the configuration described above.

In this case, the decoupling power-supply-side through-electrode wiring lines 5 may be connected (coupled) to each other near the end portions of the decoupling power-supply-side through-electrode wiring lines 5. The decoupling ground-side through-electrode wiring lines 6 may be connected (coupled) to each other near the end portions of the decoupling ground-side through-electrode wiring lines 6. For example, the decoupling power-supply-side through-electrode wiring lines 5 may be coupled parallel to each other, and the decoupling ground-side through-electrode wiring lines 6 may be coupled parallel to each other.

It may also be seen that one decoupling through-electrode transmission line 7 including one decoupling power-supply-side through-electrode wiring line 5 and one decoupling ground-side through-electrode wiring line 6 and another decoupling through-electrode transmission line 7 including one decoupling power-supply-side through-electrode wiring line 5 and one decoupling ground-side through-electrode wiring line 6, for example, two decoupling through-electrode transmission lines 7 are coupled parallel to each other.

As described above, the decoupling through-electrode transmission line 7 may include the mutually coupled decoupling power-supply-side through-electrode wiring lines 5 and the mutually coupled decoupling ground-side through-electrode wiring lines 6. The characteristic impedance of the decoupling through-electrode transmission line 7 may be reduced. For example, N1 pieces of decoupling through-electrode transmission lines 7 each having the characteristic impedance Z1 are coupled parallel to each other, and the decoupling through-electrode transmission lines 7 having a total characteristic impedance of $Z=Z1/N1$ may thus be formed. For example, when 100 (N1=100) decoupling through-electrode transmission lines 7 each having a characteristic impedance of $Z1=10\Omega$ are coupled parallel to each other, the decoupling through-electrode transmission lines 7 having a total characteristic impedance of $Z=10/100=0.1\Omega$ are formed.

Figure 5:
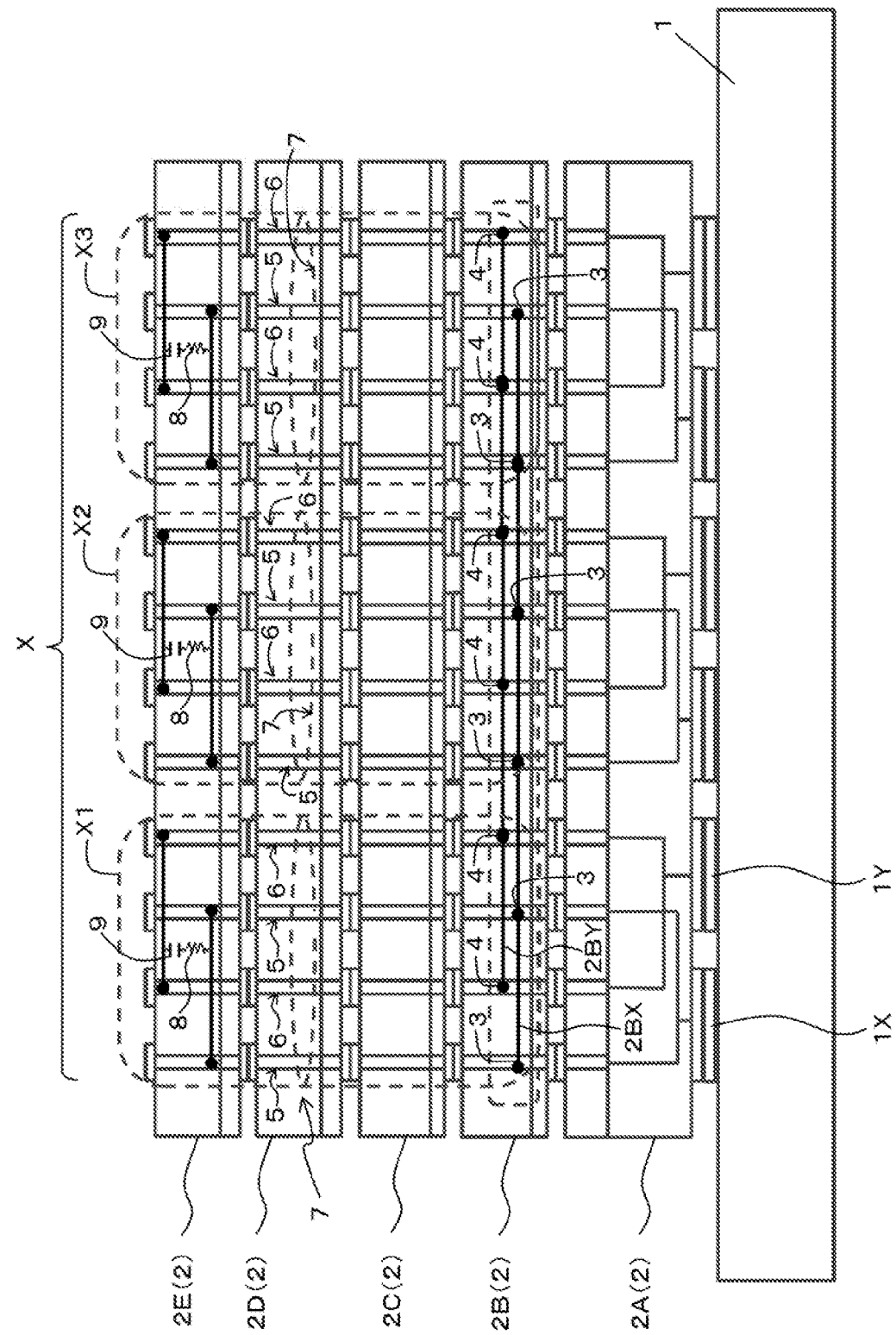
FIG. 5 illustrates an example of a stacked semiconductor device.

In a case where a value of the characteristic impedance Z1 of each decoupling through-electrode transmission line 7 is not sufficiently low, parallel connection of the decoupling through-electrode transmission lines 7 may lead to a sufficiently low value of the total characteristic impedance Z of the decoupling through-electrode transmission lines 7. For example, in a case where the decoupling through-electrode transmission lines 7 are not arranged parallel to each other, one decoupling through-electrode transmission line 7 may include a plurality of decoupling power-supply-side through-electrode wiring lines 5 and a plurality of decoupling ground-side through-electrode wiring lines 6. One decoupling through-electrode transmission line 7 may include one or more decoupling power-supply-side through-electrode wiring lines 5 and one or more decoupling ground-side through-electrode wiring lines 6. FIG. 5 illustrates an example of a stacked semiconductor device. For example, as illustrated in FIG. 5, a plurality of decoupling through-electrode transmission lines 7 may be arranged (see regions enclosed by dotted lines and denoted by X1, X2, and X3, respectively, in FIG. 5), the decoupling through-electrode transmission lines 7 each including one or more, for example, two decoupling power-supply-side through-electrode wiring lines 5 and one or more, for example, two decoupling ground-side through-electrode wiring lines 6. For example, the decoupling through-electrode transmission lines 7 each including one or more decoupling power-supply-side through-electrode wiring lines 5 and one or more decoupling ground-side through-electrode wiring lines 6 may be provided parallel to each other.

In this case, the decoupling through-electrode transmission lines 7 are each independently provided and are coupled parallel to each of the in-chip power-supply wiring line 2BX and the in-chip ground wiring line 2BY through the power-supply terminals 3 and the ground terminals 4. The decoupling through-electrode transmission lines 7 illustrated in FIG. 4 may also be provided parallel to each other.

FIG. 5 illustrates decoupling structures each using the decoupling through-electrode transmission line 7 for the second-lowest integrated-circuit chip 2B that is a power-supply target chip illustrated in FIG. 4. The decoupling structures are, for example, three structures that are each denoted by X illustrated in FIG. 4 and that are coupled parallel to each other, and are, for example, structures enclosed by dotted lines and denoted by X1, X2, and X3, respectively, illustrated in FIG. 5. Illustration of the decoupling structures each using the decoupling through-electrode transmission line 7 that are coupled to the third- and fourth-lowest integrated-circuit chips 2C and 2D that are other power-supply target chips may be omitted. A larger number of decoupling structures each using the decoupling through-electrode transmission line 7 may also be coupled parallel to each other.

The total impedance of the decoupling through-electrode transmission lines 7 may be reduced. For example, N1 pieces of decoupling through-electrode transmission lines 7 each having the characteristic impedance Z1 are coupled parallel to each other, and N2 groups of the N1 decoupling structures each using the decoupling through-electrode transmission line 7 are further coupled parallel to each other. This may result in the decoupling through-electrode transmission lines 7 having a total impedance of $Z=(Z1/N1)/N2=Z1/(N1\times N2)$. For example, ten (N1=10) decoupling through-electrode transmission lines 7 each having a characteristic impedance $Z1=10$ SI are coupled parallel to each other. Further, 100 (N2=100) groups of the ten decoupling structures each using the decoupling through-electrode transmission line 7 are coupled parallel to each other. This may result in the decoupling through-electrode transmission lines 7 having a total impedance of $Z=10/(10\times100)=0.01\Omega$.

Figure 6:
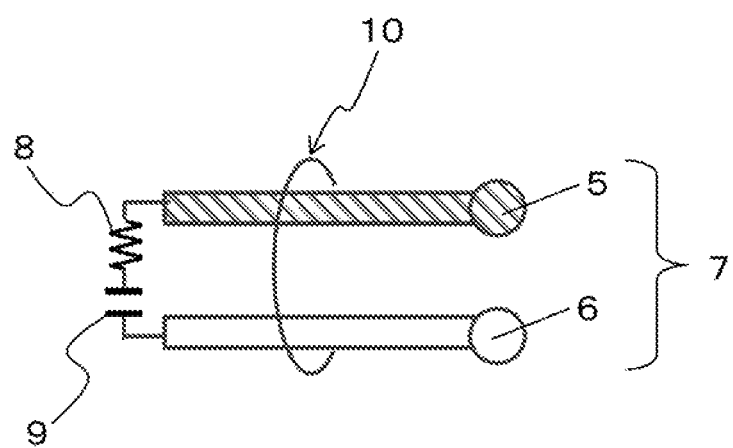
FIG. 6 illustrates an example of a stacked semiconductor device.

As described above, in a case where the value of the characteristic impedance Z1 of each decoupling through-electrode transmission line 7 is not sufficiently low, a plurality of decoupling through-electrode transmission lines 7 are coupled to each other and groups of the plurality of decoupling structures each including the decoupling through-electrode transmission line 7 are further coupled to each other. This may provide a sufficiently low value of the total impedance Z of the decoupling through-electrode transmission lines 7. To reduce the total impedance, parasitic inductance generated in connection wiring lines or the like coupled to the resistor 8 and the capacitor 9 is reduced without drastically increasing the number of decoupling through electrodes coupled to a pair of the resistor 8 and the capacitor 9. FIG. 6 illustrates an example of stacked semiconductor device. As illustrated in FIG. 6, an integrated-circuit chip in which the resistor 8 and the capacitor 9 are disposed, for example, the highest integrated-circuit chip 2E includes a transmission line (termination-side transmission line) 10 having a characteristic impedance equal to the characteristic impedance of the decoupling through-electrode transmission line 7. The resistor 8 and the capacitor 9 may be coupled to the termination of the decoupling through-electrode transmission line 7 through the transmission line 10.

For example, the resistor 8 and the capacitor 9 coupled in series and disposed in the integrated-circuit chip 2E may be coupled to the termination of the decoupling through-electrode transmission line 7 in the integrated-circuit chip 2E through the transmission line 10 having a characteristic impedance equal to the characteristic impedance of the decoupling through-electrode transmission line 7. Even in a case where a limited space hinders the resistor 8 and the capacitor 9 coupled in series from being disposed near the termination of the decoupling through-electrode transmission line 7 in the integrated-circuit chip 2E, deterioration of the high-frequency characteristic of decoupling may be reduced.

For example, a limited space may hinder the resistor 8 and the capacitor 9 coupled in series from being disposed near the termination of the decoupling through-electrode transmission line 7 in the integrated-circuit chip 2E. In such a case, the decoupling through-electrode transmission line 7 may be drawn out to a sufficiently large space in the integrated-circuit chip 2E by using the transmission line 10 having a characteristic impedance substantially equal to the characteristic impedance of the decoupling through-electrode transmission line 7 and may be coupled to the resistor 8 and the capacitor 9 disposed in the space. Accordingly, deterioration of the high-frequency characteristic of decoupling may be reduced, and a favorable high-frequency power-supply-noise reduction effect may thus be obtained.

Figure 7:
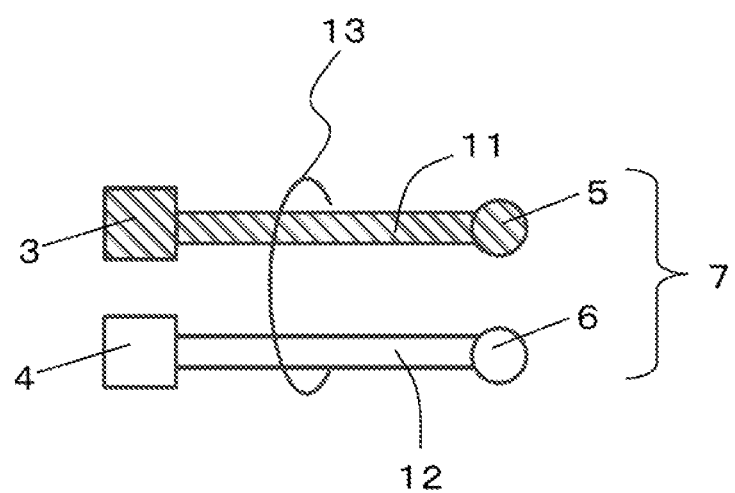
FIG. 7 illustrates an example of a stacked semiconductor device.

A power-supply wiring line or the like coupled to the integrated-circuit chip 2E may further be provided in such a manner as not to affect the characteristic of the transmission line 10 for decoupling. FIG. 7 illustrates an example of a stacked semiconductor device. As illustrated in FIG. 7, power-supply target chips, for example, the integrated-circuit chips 2B, 2C, and 2D each include a transmission line (terminal-side transmission line) 13 that includes a power-supply-side wiring line 11 coupled to the power-supply terminal 3 and a ground-side wiring line 12 coupled to the ground terminal 4 and that has a characteristic impedance substantially equal to the characteristic impedance of the decoupling through-electrode transmission line 7. The power-supply terminal 3 and the ground terminal 4 may be coupled to the decoupling through-electrode transmission line 7 through the transmission line 13.

For example, a portion where the through electrodes of each of the power-supply target chips, for example, each of the integrated-circuit chips 2B, 2C, and 2D are coupled to an in-chip power-supply wiring line may correspond to the power-supply terminal 3, and a portion where the through electrodes of each of the power-supply target chips, for example, each of the integrated-circuit chips 2B, 2C, and 2D are coupled to an in-chip ground wiring line may correspond to the ground terminal 4. In each power-supply target chip, the power-supply terminal 3 and the ground terminal 4 may be provided in a portion different from the through electrodes used as the decoupling power-supply-side through-electrode wiring line 5 and the decoupling ground-side through-electrode wiring line 6. In such a case, the power-supply target chip may be provided with the power-supply-side wiring line 11 coupled to the power-supply terminal 3 and the ground-side wiring line 12 coupled to the ground terminal 4, and the transmission line (terminal-side transmission line) 13 including the above lines may have a characteristic impedance substantially equal to the characteristic impedance of the decoupling through-electrode transmission line 7. The power-supply terminal 3 and the ground terminal 4 may be coupled to the decoupling through-electrode transmission line 7 through the transmission line 13.

Even in a case where a limited space or the like hinders the decoupling through-electrode transmission line 7 from being directly coupled to the power-supply terminal 3 that is a power-supply-noise source and the ground terminal 4 in the power-supply target chip, deterioration of the high-frequency characteristic of decoupling is reduced. For example, a limited space or the like hinders the decoupling through-electrode transmission line 7 from being provided near the power-supply terminal 3 that is a power-supply-noise source and the ground terminal 4 in the power-supply target chip, the decoupling through-electrode transmission line 7 may be disposed at a distance from the power-supply terminal 3 and the ground terminal 4. In such a case, in the power-supply target chip, the decoupling through-electrode transmission line 7 may be drawn out to a sufficiently large space by using the transmission line 13 having a characteristic impedance substantially equal to the characteristic impedance of the decoupling through-electrode transmission line 7. Connection of the decoupling through-electrode transmission line 7 to the power-supply terminal 3 and the ground terminal 4 through the transmission line 13 may lead to reduction in deterioration of the high-frequency characteristic of decoupling, and a favorable high-frequency power-supply-noise reduction effect may thus be obtained.

Wiring lines or the like coupled to the power-supply target chip may further be provided in such a manner as not to affect the characteristic of the transmission line 13 for decoupling. FIG. 8A illustrates an example of a plan view of a stacked semiconductor device. FIG. 8B illustrates an example of perspective view of a stacked semiconductor device. As illustrated in FIGS. 8A and 8B, at least one decoupling ground-side through-electrode wiring line 6 may be provided around the decoupling power-supply-side through-electrode wiring line 5. For example, as illustrated in FIG. 8A, the decoupling ground-side through-electrode wiring lines 6 may be provided in such a manner as to surround the decoupling power-supply-side through-electrode wiring lines 5. For example, as illustrated in FIG. 8B, the decoupling ground-side through-electrode wiring line 6 may be provided in such a manner as to wrap around the decoupling power-supply-side through-electrode wiring line 5. For example, the decoupling ground-side through-electrode wiring line 6 may be provided in such a manner as to wrap around the decoupling power-supply-side through-electrode wiring line 5 with an insulating material 14 placed therebetween. In this case, a coaxial decoupling through-electrode transmission line 7 is formed. Such a structure may be suitable for a case where ground noise is lower than power-supply noise. An effect of shielding the decoupling power-supply-side through-electrode wiring line 5 is expected, and an improved characteristic of the transmission line 7 and a noise-emission-reduction effect may be obtained. The decoupling through-electrode transmission line 7 extends toward a portion above a corresponding one of the power-supply target chips, for example, the integrated-circuit chips 2B, 2C, and 2D, and the resistor 8 and the capacitor 9 may be disposed in the highest integrated-circuit chip 2E of the plurality of integrated-circuit chips 2.

Figure 9:
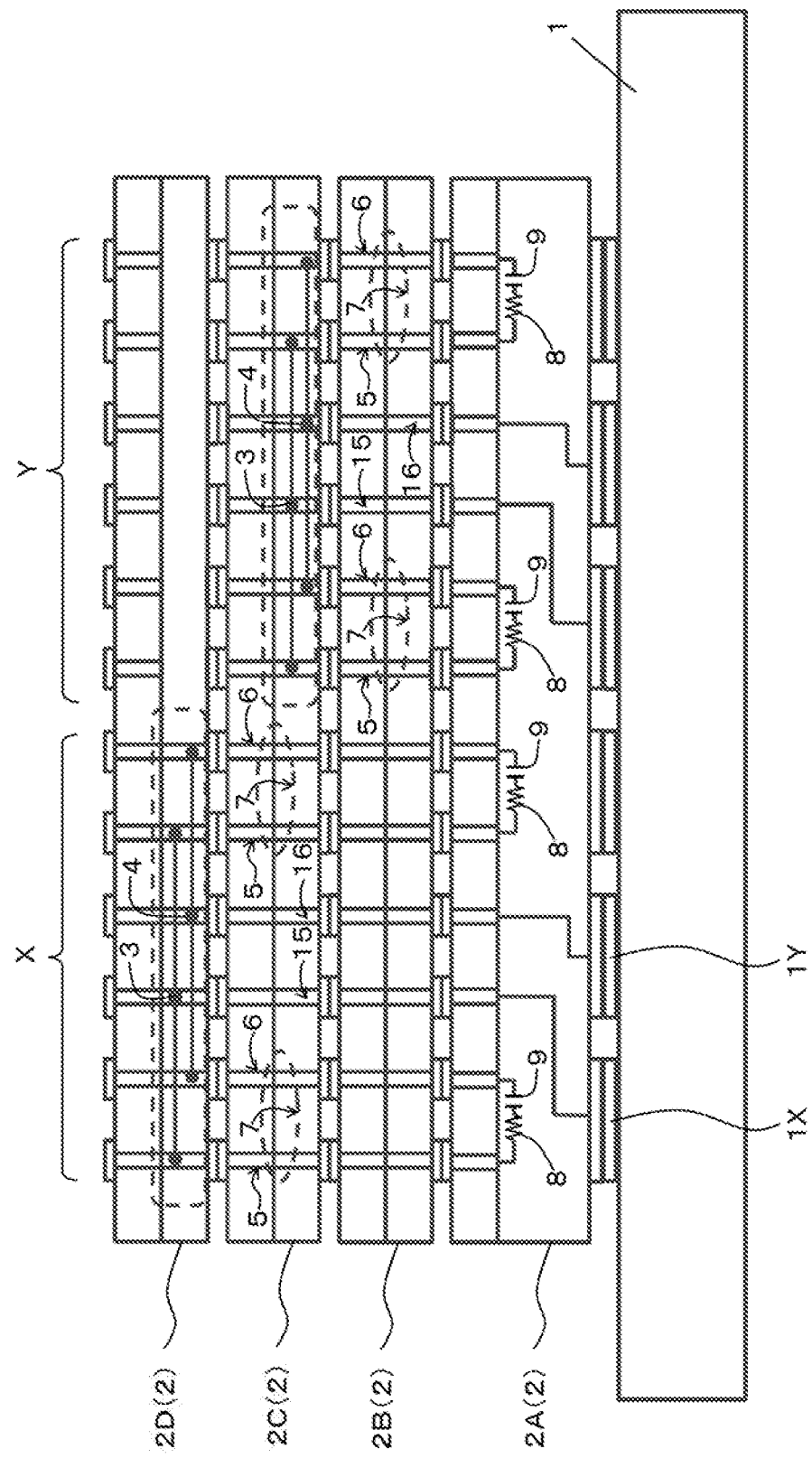
FIG. 9 illustrates an example of a cross-sectional view of a stacked semiconductor device.

FIG. 9 illustrates an example of a cross-sectional view of a stacked semiconductor device. For example, as illustrated in FIG. 9, the decoupling through-electrode transmission line 7 may extend toward a portion below a corresponding one of the power-supply target chips, for example, the integrated-circuit chips 2B, 2C, and 2D, and the resistor 8 and the capacitor 9 may be disposed in the lowest (substrate side) integrated-circuit chip 2A of the plurality of integrated-circuit chips 2. For example, if the lowest integrated-circuit chip 2A having a function of a connection interface with the substrate 1 has the configuration of the highest integrated-circuit chip 2E, the highest integrated-circuit chip 2E does not have to be provided. This may reduce an increase of the number of stacked chips.

In this case, power-supply wiring lines 15 and ground wiring lines 16 may be provided by using through electrodes and the like in such a manner that each power-supply wiring line 15 and each ground wiring line 16 extend from the lowest integrated-circuit chip 2A to the power-supply target chips, for example, the integrated-circuit chips 2B, 2C, and 2D, and the power is supplied to the power-supply target chips. In addition to the power-supply wiring line 15 and the ground wiring line 16 that are described above, the decoupling power-supply-side through-electrode wiring line 5 and the decoupling ground-side through-electrode wiring line 6 may be provided by using the through electrodes and the like in such a manner that the power-supply-side through-electrode wiring line 5 and the decoupling ground-side through-electrode wiring line 6 are respectively coupled to the power-supply terminal 3 and the ground terminal 4 of the power-supply target chip and extend to the lowest integrated-circuit chip 2A. The power-supply-side through-electrode wiring line 5 and the decoupling ground-side through-electrode wiring line 6 may form the decoupling through-electrode transmission line 7. In the lowest integrated-circuit chip 2A, the resistor 8 having an impedance substantially equal to the characteristic impedance of the decoupling through-electrode transmission line 7 and the capacitor 9 may be coupled to the termination of the decoupling through-electrode transmission line 7.

FIG. 9 illustrates a structure in which two decoupling structures each using the decoupling through-electrode transmission line 7 that are provided to the highest integrated-circuit chip 2D that is a power-supply target chip are coupled parallel to each other, for example, a region denoted by X illustrated in FIG. 9, and a structure in which two decoupling structures each using the decoupling through-electrode transmission line 7 that are provided to the third-lowest integrated-circuit chip 2C that is a power-supply target chip are coupled parallel to each other, for example, a region denoted Y illustrated in FIG. 9. Illustration of decoupling structures each using the decoupling through-electrode transmission line 7 that are coupled to the second-lowest integrated-circuit chip 2B that is another power-supply target chip may be omitted.

Two decoupling structures each using the decoupling through-electrode transmission line 7 may be coupled parallel to each other. One decoupling structure using the decoupling through-electrode transmission line 7 may also be provided. A plurality of decoupling structures each using the decoupling through-electrode transmission line 7 may also be coupled parallel to each other.

The decoupling through-electrode transmission lines 7 each including one or more decoupling power-supply-side through-electrode wiring lines 5 and one or more decoupling ground-side through-electrode wiring lines 6 may be provided parallel to each other. The stacked semiconductor devices illustrated in FIGS. 6 to 8B may also be applied. In a case where the stacked semiconductor device illustrated in FIG. 6 is applied, the lowest integrated-circuit chip 2A may include the termination-side transmission line 10 having a characteristic impedance equal to the characteristic impedance of the decoupling through-electrode transmission line 7, and the resistor 8 and the capacitor 9 may be coupled to the termination of the decoupling through-electrode transmission line 7 through the termination-side transmission line 10.

Figure 10:
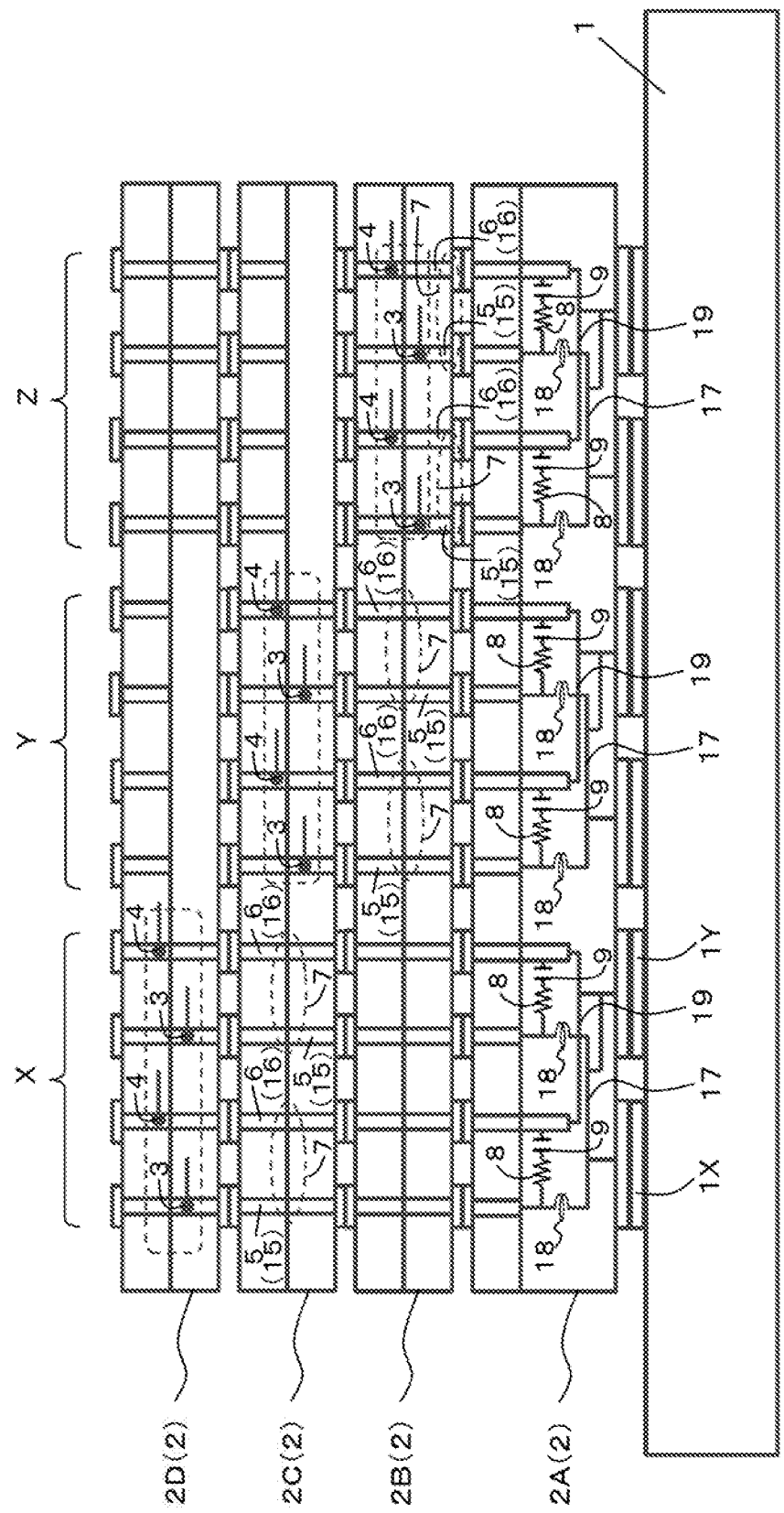
FIG. 10 illustrates an example of a cross-sectional view of a stacked semiconductor device.

FIG. 10 illustrates an example of a cross-sectional view of a stacked semiconductor device. Like FIG. 9, for example, as illustrated in FIG. 10, each decoupling through-electrode transmission line 7 may extend toward a portion below a corresponding one of the power-supply target chips, for example, the integrated-circuit chips 2B, 2C, and 2D, and each resistor 8 and each capacitor 9 may be disposed in the lowest (on the substrate side) integrated-circuit chip 2A of the plurality of integrated-circuit chips 2. For example, the lowest integrated-circuit chip 2A having the function of a connection interface with the substrate 1 may have the configuration of the highest integrated-circuit chip 2E, and the highest integrated-circuit chip 2E does not have to be provided. Accordingly, an increase of the number of stacked chips may be reduced.

Unlike FIG. 10, the power-supply wiring line 15 and the ground wiring line 16 that extend from the lowest integrated-circuit chip 2A to a corresponding one of the power-supply target chips, for example, the integrated-circuit chips 2B, 2C, and 2D, and that include the through electrodes and the like may serve as the decoupling power-supply-side through-electrode wiring line 5 and the decoupling ground-side through-electrode wiring line 6, respectively. The number of through electrodes may be reduced as a whole.

To supply power to the corresponding one of the power-supply target chips, for example, the integrated-circuit chips 2B, 2C, and 2D, the power-supply wiring line 15 and the ground wiring line 16 may be provided by using the through electrodes and the like in such a manner as to extend from the lowest integrated-circuit chip 2A to the power-supply target chip. The power-supply wiring line 15 and the ground wiring line 16 may also be used as the decoupling power-supply-side through-electrode wiring line 5 and the decoupling ground-side through-electrode wiring line 6 that are respectively coupled to the power-supply terminal 3 and the ground terminal 4 of the power-supply target chip and that extend to the lowest integrated-circuit chip 2A. The decoupling power-supply-side through-electrode wiring line 5 and the decoupling ground-side through-electrode wiring line 6 may form the decoupling through-electrode transmission line 7. In the lowest integrated-circuit chip 2A, the resistor 8 having an impedance substantially equal to the characteristic impedance of the decoupling through-electrode transmission line 7 and the capacitor 9 may be coupled to the termination of the decoupling through-electrode transmission line 7.

In this case, power-supply wiring lines 17 that are lines for supplying power from outside and ground wiring lines 19 may be provided in the lowest integrated-circuit chip 2A, and may be coupled, through low-pass filters 18, to the decoupling power-supply-side through-electrode wiring lines 5 and the decoupling ground-side through-electrode wiring lines 6 included in the decoupling through-electrode transmission lines 7. For example, the lowest integrated-circuit chip 2A may include the power-supply wiring lines 17, the ground wiring lines 19, and the low-pass filters 18. The decoupling power-supply-side through-electrode wiring lines 5 and the decoupling ground-side through-electrode wiring lines 6 may be coupled, on the termination of the decoupling through-electrode transmission lines 7, to the power-supply wiring lines 17 and the ground wiring lines 19 through the low-pass filters 18.

In frequencies higher than the cutoff frequency of each low-pass filter 18, the connection position for the resistor 8 and the capacitor 9 may be substantially the termination position for a decoupling transmission line. A power-supply-noise emission reduction effect or the like may be obtained. An inductor serving as the low-pass filter 18 may be disposed between the power-supply wiring line 17 and the decoupling power-supply-side through-electrode wiring line 5. The inductor serving as the low-pass filter 18 may cause reduction in propagation of high-frequency current to the substrate 1. Another inductor may also be disposed between the ground wiring line 19 and the decoupling ground-side through-electrode wiring line 6, and the two inductors may form the low-pass filter 18. Low-pass filters in a more complicated configuration may also be used.

FIG. 10 illustrates structures in each of which two decoupling structures each using the decoupling through-electrode transmission line 7 that are provided to a corresponding one of the highest integrated-circuit chip 2D, the third-lowest integrated-circuit chip 2C, and the second-lowest integrated-circuit chip 2B that are power-supply target chips are coupled parallel to each other, for example, regions respectively denoted by X, Y, and Z in FIG. 10. For example, to each power-supply target chip, one decoupling structure using the decoupling through-electrode transmission line 7 may be provided, or a plurality of decoupling structures each using the decoupling through-electrode transmission line 7 may be coupled parallel to each other.

Figure 11:
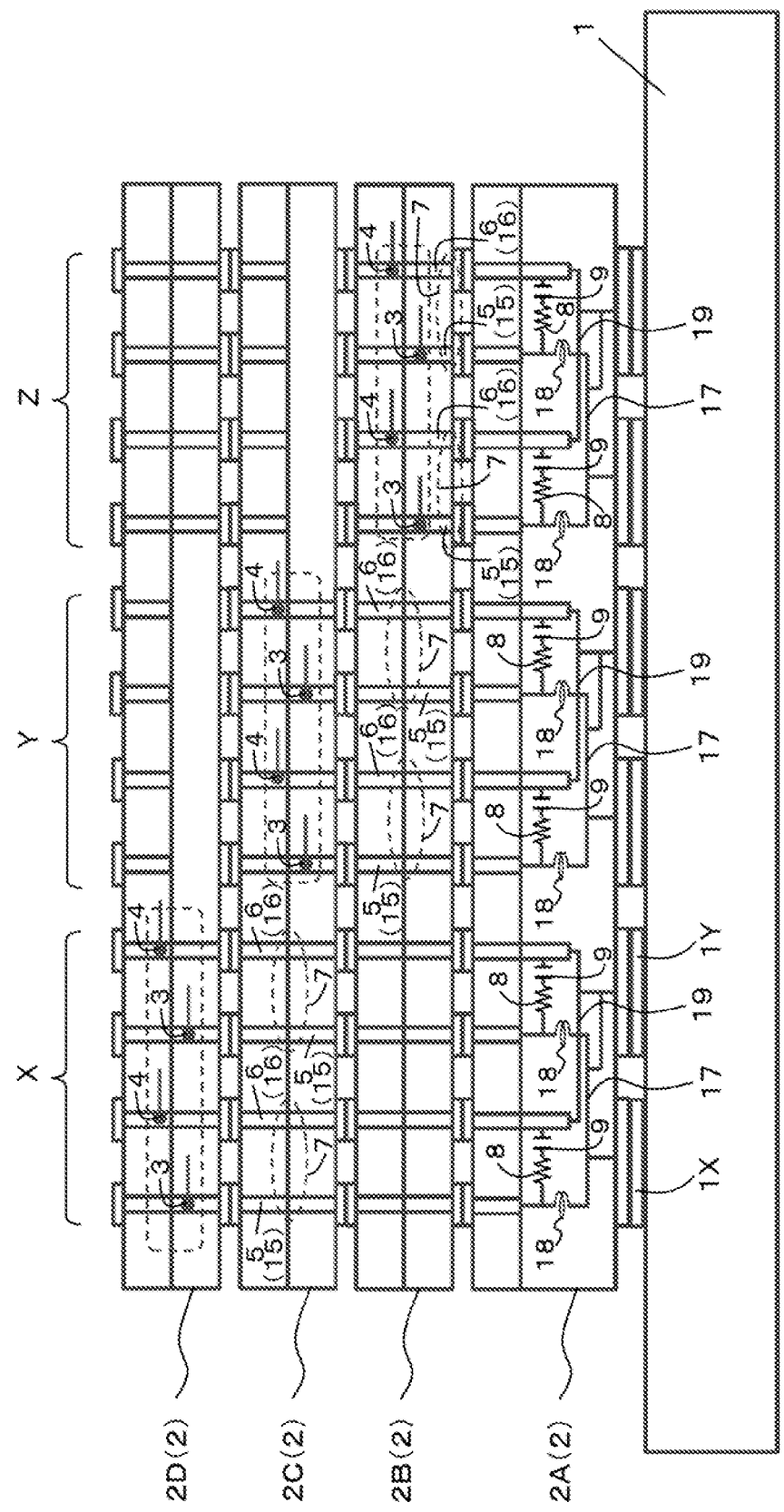
FIG. 11 illustrates an example of a cross-sectional view of a stacked semiconductor device.

As illustrated in FIG. 5, the decoupling through-electrode transmission lines 7 each including one or more decoupling power-supply-side through-electrode wiring lines 5 and one or more decoupling ground-side through-electrode wiring lines 6 may be provided parallel to each other. The stacked semiconductor devices illustrated in FIGS. 6 to 8B may also be applied. In a case where the stacked semiconductor device illustrated in FIG. 6 is applied, the lowest integrated-circuit chip 2A may include the termination-side transmission line 10 having a characteristic impedance equal to the characteristic impedance of the decoupling through-electrode transmission line 7, and the resistor 8 and the capacitor 9 may be coupled to the termination of the decoupling through-electrode transmission line 7 through the termination-side transmission line 10. FIG. 11 illustrates a example of a cross-sectional view of a stacked semiconductor device. For example, as illustrated in FIG. 11, decoupling through-electrode transmission lines 7X each extending toward a portion above a corresponding one of the power-supply target chips, for example, the integrated-circuit chips 2B, 2C, and 2D may be added to the stacked semiconductor device illustrated in FIG. 10. In the highest integrated-circuit chip 2E, resistors 8X each having an impedance equal to the characteristic impedance of a corresponding one of the decoupling through-electrode transmission lines 7X and capacitors 9X may also be coupled to the termination of the decoupling through-electrode transmission lines 7X.

The decoupling through-electrode transmission lines 7 and 7X may be provided in such a manner as to respectively extend toward a portion below and a portion above the corresponding one of the power-supply target chips, for example, the integrated-circuit chips 2B, 2C, and 2D. The resistors 8 and 8X that have impedances equal to the characteristic impedances of the decoupling through-electrode transmission lines 7 and 7X and the capacitors 9 and 9X may be coupled to the termination of the decoupling through-electrode transmission lines 7 and 7X in the lowest integrated-circuit chip 2A and the highest integrated-circuit chip 2E.

In this case, the upper decoupling through-electrode transmission line 7X extending toward a portion above the power-supply target chip and the lower decoupling through-electrode transmission lines 7 extending toward a portion below the power-supply target chip may be used as decoupling through-electrode transmission lines. As resistors and capacitors, the upper resistor 8X, the upper capacitor 9X, the lower resistor 8, and the lower capacitor 9 may be provided. The upper resistor 8X and the upper capacitor 9X are disposed in the highest integrated-circuit chip 2E of the plurality of integrated-circuit chips 2 and are coupled to the termination of the upper decoupling through-electrode transmission line 7X, the upper resistor 8X having an impedance substantially equal to the characteristic impedance of the upper decoupling through-electrode transmission line 7X. The lower resistor 8 and the lower capacitor 9 are disposed in the lowest integrated-circuit chip 2A of the plurality of integrated-circuit chips 2 and are coupled to the termination of the lower decoupling through-electrode transmission line 7, the lower resistor 8 having an impedance substantially equal to the characteristic impedance of the lower decoupling through-electrode transmission line 7. The lowest integrated-circuit chip 2A may include the power-supply wiring lines 17, the ground wiring lines 19, and the low-pass filters 18. The decoupling power-supply-side through-electrode wiring lines 5 and the decoupling ground-side through-electrode wiring lines 6 included in the lower decoupling through-electrode transmission lines 7 may be coupled, on the termination of the lower decoupling through-electrode transmission lines 7, to the power-supply wiring lines 17 and the ground wiring lines 19 through low-pass filters, for example, inductors serving as the low-pass filters 18. Each low-pass filter 18 may be the same as that described with reference to FIG. 10.

The decoupling through-electrode transmission lines 7 and 7X may be provided at an upper side and a lower side of the power-supply target chip, and the resistors 8 and 8X that have impedances equal to the characteristic impedances of the decoupling through-electrode transmission lines 7 and 7X and the capacitors 9 and 9X may be coupled to the termination of the decoupling through-electrode transmission lines 7 and 7X. The decoupling function may thus be enhanced. For example, the integrated-circuit chips 2A and 2E include the resistors 8 and 8X that have impedances substantially equal to the characteristic impedances of the decoupling through-electrode transmission lines 7 and 7X and the capacitors 9 and 9X, and the integrated-circuit chips 2A and 2E, for example, the integrated-circuit chips 2 having the decoupling function may be provided in such a manner that the integrated circuit chips 2B to 2D that are the power-supply target chips are sandwiched between the integrated-circuit chips 2A and 2E in the up-down direction. The integrated-circuit chips 2A to 2E may be coupled through the decoupling through-electrode transmission lines 7 and 7X, and the decoupling function may thereby be enhanced.

FIG. 11 illustrates structures in each of which two decoupling structures each using the decoupling through-electrode transmission lines 7 and 7X, which corresponds to one of the fourth-lowest integrated-circuit chip 2D, the third-lowest integrated-circuit chip 2C, and the second-lowest integrated-circuit chip 2B that are the power-supply target chips, are coupled parallel to each other, for example, regions respectively denoted by X, Y, and Z in FIG. 11. To each power-supply target chip, one decoupling structure using the decoupling through-electrode transmission lines 7 and 7X may be provided, and a plurality of decoupling structures each using the decoupling through-electrode transmission lines 7 and 7X may also be coupled parallel to each other.

Figure 12:
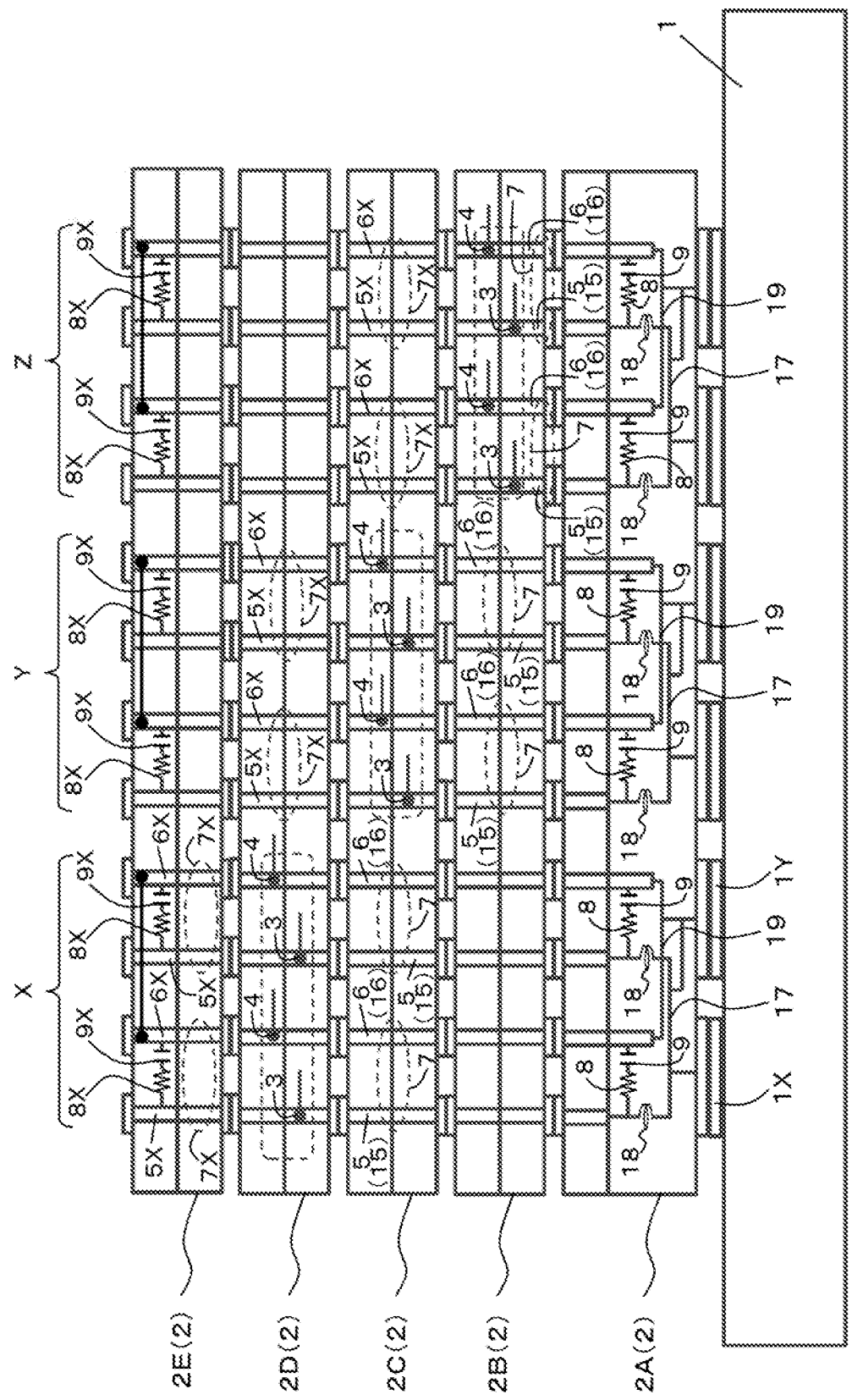
FIG. 12 illustrates an example of a cross-sectional view of a stacked semiconductor device.

For example, as illustrated in the structure illustrated in FIG. 5, the decoupling through-electrode transmission lines 7 and 7X including one or more decoupling power-supply-side through-electrode wiring lines 5 and 5X and one or more decoupling ground-side through-electrode wiring lines 6 and 6X may be provided parallel to each other. The stacked semiconductor devices illustrated in FIGS. 6 to 8B may also be applied. In a case where the stacked semiconductor device illustrated in FIG. 6 is applied, the highest integrated-circuit chip 2E may include an upper termination-side transmission line 10 having a characteristic impedance substantially equal to the characteristic impedance of the upper decoupling through-electrode transmission line 7X, and the upper resistor 8X and the upper capacitor 9X may be coupled to the termination of the upper decoupling through-electrode transmission line 7X through the upper termination-side transmission line 10. The lowest integrated-circuit chip 2A may include a lower termination-side transmission line 10 having a characteristic impedance equal to the characteristic impedance of the lower decoupling through-electrode transmission line 7. The lower resistor 8 and the lower capacitor 9 may also be coupled to the termination of the lower decoupling through-electrode transmission line 7 through the lower termination-side transmission line 10. For example, as illustrated in FIG. 12, adjustment capacitors 20 may be provided to the stacked semiconductor device illustrated in FIG. 10. Each adjustment capacitor 20 is coupled between the decoupling power-supply-side through-electrode wiring line 5 and the decoupling ground-side through-electrode wiring line 6 included in the decoupling through-electrode transmission line 7 and adjusts the characteristic impedance of the decoupling through-electrode transmission line 7.

In this case, the adjustment capacitor 20 may be provided in any chip sandwiched between any one of the power-supply target chips, for example, the integrated-circuit chips 2B, 2C, or 2D and the integrated-circuit chip having the decoupling function, for example, the integrated-circuit chip 2A. The adjustment capacitor 20 may be provided in the power-supply target chip and the integrated-circuit chip having the decoupling function or may not be provided. While distributed capacitances of the decoupling through-electrode transmission line 7 are being approximately increased to reduce variation in characteristic impedance, the value of the characteristic impedance is decreased. The decoupling effect may thereby be enhanced.

The stacked semiconductor device illustrated in FIG. 12 may be combined with the stacked semiconductor device illustrated in any of FIGS. 4 to 9 and FIG. 11.

For example, an integrated-circuit chip having the decoupling function may be provided as an out-chip decoupling function outside a power-supply target chip. A resistor having an impedance substantially equal to the characteristic impedance of the decoupling through-electrode transmission line and a capacitor may be coupled to the termination of the decoupling through-electrode transmission line.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A stacked semiconductor device comprising:
   a plurality of stacked integrated-circuit chips that are to be mounted onto a substrate and including at least one power-supply target chip;
   a decoupling through-electrode transmission line including a decoupling power-supply-side through-electrode wiring line coupled to a power-supply terminal of the at least one power-supply target chip and a decoupling ground-side through-electrode wiring line coupled to a ground terminal of the at least one power-supply target chip;
   a resistor and a capacitor provided on one of the plurality of stacked integrated-circuit chips that is located at a termination of the decoupling through-electrode transmission line, the resistor having an impedance substantially equal to a characteristic impedance of the decoupling through-electrode transmission line, wherein the resistor and the capacitor are coupled in series.

2. The stacked semiconductor device according to claim 1, wherein a first end of the resistor is coupled to one of the power-supply terminal and the ground terminal, a second end of the resistor is coupled to a first end of the capacitor, and a second end of the capacitor is coupled to the another of the power-supply terminal and the ground terminal.

3. The stacked semiconductor device according to claim 1, wherein another decoupling through-electrode transmission line is arranged along with the decoupling through-electrode transmission lines.

4. The stacked semiconductor device according to claim 1, wherein the at least one power-supply target chip includes a power-supply-side wiring line coupled to the power-supply terminal, a ground-side wiring line coupled to the ground terminal, and a terminal-side transmission line having a characteristic impedance substantially equal to the characteristic impedance of the decoupling through-electrode transmission line, and wherein the power-supply terminal and the ground terminal are coupled to the decoupling through-electrode transmission line through the terminal-side transmission line.

5. The stacked semiconductor device according to claim 1, wherein the decoupling ground-side through-electrode wiring line is provided around the decoupling power-supply-side through-electrode wiring line.

6. The stacked semiconductor device according to claim 1, wherein the decoupling through-electrode transmission line extends toward a portion above the at least one power-supply target chip, and wherein the resistor and the capacitor are provided in a highest integrated-circuit chip of the plurality of stacked integrated-circuit chips.

7. The stacked semiconductor device according to claim 1, wherein the decoupling through-electrode transmission line extends toward a portion below the at least one power-supply target chip, and wherein the resistor and the capacitor are provided in a lowest integrated-circuit chip of the plurality of stacked integrated-circuit chips.

8. The stacked semiconductor device according to claim 7, wherein the lowest integrated-circuit chip includes a power-supply wiring line, a ground wiring line, and a low-pass filter, and wherein the decoupling power-supply-side through-electrode wiring line and the decoupling ground-side through-electrode wiring line are coupled, at the termination of the decoupling through-electrode transmission line, to the power-supply wiring line and the ground wiring line, respectively, through the low-pass filter.

9. The stacked semiconductor device according to claim 1, wherein the decoupling through-electrode transmission line includes an upper decoupling through-electrode transmission line extending toward a portion above the at least one power-supply target chip and a lower decoupling through-electrode transmission line extending toward a portion below the at least one power-supply target chip, the resistor and the capacitor includes an upper resistor and a upper capacitor provided in a highest stacked integrated-circuit chip of the plurality of integrated-circuit chips and coupled to a termination of the upper decoupling through-electrode transmission line and a lower resistor and a lower capacitor provided in a lowest stacked integrated-circuit chip of the plurality of integrated-circuit chips and coupled to a termination of the lower decoupling through-electrode transmission line, the upper resistor having an impedance substantially equal to a characteristic impedance of the upper decoupling through-electrode transmission line, and the lower resistor having an impedance substantially equal to the characteristic impedance of the lower decoupling through-electrode transmission line.

10. The stacked semiconductor device according to claim 9, wherein the lowest integrated-circuit chip includes a power-supply wiring line, a ground wiring line, and a low-pass filter, and wherein the decoupling power-supply-side through-electrode wiring line and the decoupling ground-side through-electrode wiring line, at the termination of the lower decoupling through-electrode transmission line, to the power-supply wiring line and the ground wiring line, respectively, through the low-pass filter.

11. The stacked semiconductor device according to claim 1, wherein one of the a plurality of stacked integrated-circuit chips includes a termination-side transmission line having a characteristic impedance substantially equal to the characteristic impedance of the decoupling through-electrode transmission line, and wherein the resistor and the capacitor are coupled to the termination of the decoupling through-electrode transmission line through the termination-side transmission line.

12. The stacked semiconductor device according to claim 1, further comprising: an adjustment capacitor, coupled between the decoupling power-supply-side through-electrode wiring line and the decoupling ground-side through-electrode wiring line, configured to adjust the characteristic impedance of the decoupling through-electrode transmission line.

* * * * *